US005506086A

United States Patent [19]

Van Zoeren

[11] Patent Number: 5,506,086
[45] Date of Patent: Apr. 9, 1996

[54] PROCESS FOR MAKING A FLEXOGRAPHIC PRINTING PLATE

[75] Inventor: Carol M. Van Zoeren, Wilmington, Del.

[73] Assignee: E. I. du Pont de Nemours and Company, Wilmington, Del.

[21] Appl. No.: 431,600

[22] Filed: May 1, 1995

[51] Int. Cl.[6] .............................. G03C 1/72; G03C 1/815; G03C 5/16; G03F 1/16
[52] U.S. Cl. .................. 430/201; 430/271.1; 430/273.1; 430/306; 430/309; 430/327; 430/328; 430/330; 430/964
[58] Field of Search .................................. 430/201, 309, 430/306, 273, 271, 327, 328, 330, 964

[56] References Cited

U.S. PATENT DOCUMENTS

| | | | |
|---|---|---|---|
| 3,787,210 | 1/1974 | Roberts | 430/201 |
| 4,020,762 | 5/1977 | Perterson | 430/964 |
| 4,132,168 | 1/1979 | Peterson | 101/471 |
| 4,245,003 | 1/1981 | Oransky et al. | 430/964 |
| 4,588,674 | 5/1986 | Stewart et al. | 430/20 |
| 4,702,958 | 10/1987 | Itoh et al. | 430/945 |
| 4,711,834 | 12/1987 | Butters et al. | 430/201 |
| 4,973,572 | 11/1990 | De Boer | 430/201 |
| 5,156,938 | 10/1992 | Foley et al. | 430/200 |
| 5,256,506 | 10/1993 | Ellis et al. | 430/201 |
| 5,262,275 | 11/1993 | Fan | 430/273 |
| 5,278,023 | 1/1994 | Bills et al. | 430/201 |
| 5,351,617 | 10/1994 | Williams et al. | 101/467 |

FOREIGN PATENT DOCUMENTS 2176018  12/1986  United Kingdom ............. B41M 5/26

Primary Examiner—Richard L. Schilling

[57] ABSTRACT

This invention relates to a process for making a flexographic printing plate from a photosensitive printing element having an infrared reduction ablatable layer capable of being selectively removed by a laser beam and wherein the process includes placing a material capture sheet in proximity to a photopolymer layer.

15 Claims, No Drawings

PROCESS FOR MAKING A FLEXOGRAPHIC PRINTING PLATE

BACKGROUND OF THE INVENTION

This invention relates to a process for making a flexographic printing plate from a photosensitive printing element, particularly a flexographic element having an infrared ablatable layer capable of being selectively removed by a laser beam.

DESCRIPTION OF THE RELATED ART

Flexographic printing plates are well known for use in printing, particularly on surfaces which are soft and easily deformable, such as packaging materials, e.g., cardboard, plastic films, etc. Flexographic printing plates can be prepared from photopolymerizable compositions, such as those described in U.S. Pat. Nos. 4,323,637 and 4,427,749. The photopolymerizable compositions generally comprise an elastomeric binder, at least one monomer and a photoinitiator. Photosensitive elements generally have a photopolymerizable layer interposed between a support and a coversheet or multilayer cover element. Upon imagewise exposure to actinic radiation, polymerization, and hence, insolubilization of the photopolymerizable layer occurs in the exposed areas. Treatment with a suitable solvent removes the unexposed areas of the photopolymerizable layer leaving a printing relief which can be used for flexographic printing.

Imagewise exposure of a photosensitive element requires the use of a phototool which is a mask having clear and opaque areas covering the photopolymerizable layer. The phototool prevents exposure and polymerization in the opaque areas. The phototool allows exposure to radiation in the clear areas so that these areas polymerize and remain on the support after the development step. The phototool is usually a photographic negative of the desired printing image. If corrections are needed in the final image a new negative must be made. This is a time-consuming process. In addition, the phototool may change slightly in dimension due to changes in temperature and humidity. Thus, the same phototool, when used at different times or in different environments, may give different results and could cause registration problems.

Thus, it would be desirable to eliminate the phototool by directly recording information on a photosensitive element, e.g., by means of a laser beam. The image to be developed could be translated into digital information and the digital information used to place the laser for imaging. The digital information could even be transmitted from a distant location. Corrections could be made easily and quickly by adjusting the digitized image. In addition, the digitized image could be either positive or negative, eliminating the need to have both positive-working and negative-working photosensitive materials, or positive and negative phototools. This saves storage space and, thus, reduces cost.

In general, it has not been very practical to use lasers to image the photopolymerizable layer of the elements which are used to prepare flexographic printing plates. The elements have low photosensitivity and require long exposure times even with high powered lasers. In addition, most of the photopolymerizable materials used in these elements have their greatest sensitivity in the ultraviolet (UV) range. While UV lasers are known, economical and reliable UV lasers with high power are generally not available. However, non-UV lasers are available which are relatively inexpensive, and which have a useful power output and which can be utilized to form a mask image on top of flexographic printing elements.

U.S. Pat. No. 5,262,275 and pending U.S. patent application Ser. No. 08/341,731, (IM-0672B) describe a photosensitive element and a process for making flexographic plates respectively. The element comprises a support, a photopolymer layer, at least one barrier layer, and at least one layer of infrared radiation sensitive material. The process includes the step of imagewise ablation of the element with infrared laser radiation to form a mask. The exposure to imagewise ablate the infrared radiation sensitive layer impinges the side of the photosensitive element bearing the infrared-sensitive layer. This method has the disadvantages of requiring fluences generally well above 1 Joule/cm$^2$ (J/cm$^2$) for sufficient ablation and generating airborne debris which must be collected with a vacuum exhaust located very near the point at which the laser beam impinges the element. Further, the method requires the photosensitive element to contain a barrier layer between the photopolymer layer and the infrared sensitive layer. This barrier layer complicates the manufacturing process for producing laser ablatable flexographic plates.

U.S. Pat. No. 5,156,938 discloses a method for transfering a pattern from an ablation-transfer imaging medium to a receptor element in contiguous contact therewith. The ablation-transfer imaging medium includes a support and an imaging laser radiation-ablative topcoat. The support can be either films which are transparent or non-transparent to the imaging radiation. In an embodiment which uses transparent film the laser radiation impinges the imaging material from the back or support side of the material. The reference discloses that the thickness of the support is not critical. However, the presence of additional layers, e.g., photopolymerizable layers, in the order of 20 mils and greater which are interposed between the support and the ablative topcoat layer were not contemplated. Further, the receptor sheet bearing the transfered image is the final product. This is different than the present process for making a flexographic printing element which uses laser radiation to form a mask image on top of a photosensitive element. In this case, the photosensitive element and the image which remains after laser exposure is the final product.

SUMMARY OF THE INVENTION

The present invention relates to a process for making a flexographic printing plate comprising (1) providing a photosensitive printing element comprising in the order listed:

(a) an infrared-transparent support, (b) an infrared-transparent photopolymerizable layer having at least one elastomeric binder, at least one monomer and an initiator having sensitivity to non-infrared actinic radiation, said layer being soluble, swellable, or dispersible in a developer solution, and (c) at least one layer of infrared radiation sensitive material having at least one self-ablative binder, said layer being substantially opaque to non-infrared actinic radiation;

(2) placing a material capture sheet in proximity to layer (c);

(3) imagewise ablating layer (c) through layers (a)–(b) with infrared laser radiation to form a mask;

(4) removing the material capture sheet;

(5) overall exposing the photosensitive element to actinic radiation through the mask; and (6) treating the product of step (5) with at least one developer solution to remove (i) the infrared sensitive material which was not removed during step (3), and (ii) the areas of the photopolymerizable layer (b) which were not exposed to non-infrared actinic radiation.

The invention further relates to a process for making a flexographic printing plate in which the photosensitive element additionally includes a cover sheet. The process includes removal of the cover sheet before placing a material capture sheet in proximity to the photopolymer layer and imagewise ablating the infrared sensitive layer through the infrared-transparent support and infrared-transparent photopolymer layer with infrared radiation to form a mask.

The invention further relates to a material capture sheet for capturing debris from laser ablated areas of the photosensitive printing element, in which the material capture sheet comprises 1) a support selected from the group consisting of paper and polymeric film;

2) a layer applied to the support comprising:

(i) an adhesive which is thermally activated upon laser ablation of the infrared sensitive layer (c) of the photosensitive printing element; and (ii) an infrared absorbing agent.

DETAILED DESCRIPTION OF THE INVENTION

The process of the invention combines the convenience and sensitivity of infrared laser imaging with conventional photopolymerizable compositions to produce flexographic printing plates with known good printing quality, quickly, economically, and by digital imaging means.

The photosensitive element comprises, in order, a support (a), a photopolymerizable layer (b), and a layer of infrared radiation sensitive material (c). Optionally, the photosensitive element can have at least one barrier layer (e) between the photopolymerizable layer and the layer of infrared radiation sensitive material.

The support can be any flexible material which is conventionally used with photosensitive elements used to prepare flexographic printing plates. The support must be transparent to infrared radiation, i.e., allow the infrared radiation to pass through the support unchanged or substantially unchanged. Materials that allow the infrared radiation to pass through unchanged or substantially unchanged will be referred to as infrared transparent. Examples of suitable support materials include polymeric films such as those formed by addition polymers and linear condensation polymers, transparent foams and fabrics. A preferred support is a polyester film; particularly preferred is polyethylene terephthalate. The support typically has a thickness from 2 to 10 mils (0.0051 to 0.025 cm), with a preferred thickness of 3 to 8 mils (0.0076 to 0,020 cm).

As used herein, the term "photopolymerizable" is intended to encompass systems which are photopolymerizable, photocrosslinkable, or both. The photopolymerizable layer comprises an elastomeric binder, at least one monomer and an initiator, where the initiator has a sensitivity to non-infrared actinic radiation, which throughout this specification will be meant to include visible and/or ultraviolet (UV) radiation. In most cases, the initiator will be sensitive to visible or UV radiation. Any photopolymerizable compositions which are suitable for the formation of flexographic printing plates can be used for the present invention.

Examples of suitable compositions have been disclosed, for example, in Chen et al., U.S. Pat. Nos. 4,323,637; Grüetzmacher et al., 4,427,749 and Feinberg et al., 4,894,315. Further, the photopolymerizable layer must be transparent to infrared radiation, i.e., allow the infrared radiation to pass through the photopolymer layer unattenuated or substantially unattenuated.

The elastomeric binder can be a single polymer or mixture of polymers which can be soluble, swellable or dispersible in aqueous, semi-aqueous or organic solvent developers. Binders which are soluble or dispersible in aqueous or semi-aqueous developers have been disclosed in Alles, U.S. Pat. Nos. 3,458,311; Pohl, 4,442,302; Pine, 4,361,640; Inoue et al., 3,794,494; Proskow, 4,177,074; Proskow 4,431,723; and Worns, 4,517,279. Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in Chen, U.S. Pat. Nos. 4,323,636; Heinz et al., 4,430,417; and Toda et al., 4,045,231 can be used. It is preferred that the binder be present in at least an amount of 65% by weight of the photosensitive layer.

The term binder, as used herein, encompasses core shell microgels and blends of microgels and preformed macromolecular polymers, such as those disclosed in Fryd et al., U.S. Pat. No. 4,956,252.

The photopolymerizable layer can contain a single monomer or mixture of monomers which must be compatible with the binder to the extent that a clear, non-cloudy photosensitive layer is produced. Monomers that can be used in the photopolymerizable layer are well known in the art. Examples of such monomers can be found in Chen U.S. Pat. Nos. 4,323,636; Fryd et al., 4,753,865; Fryd et al., 4,726, 877; and Feinberg et al., 4,894,315. It is preferred that the monomer be present in at least an amount of 5% by weight of the photopolymerizable layer.

The photoinitiator can be any single compound or combination of compounds which is sensitive to non-infrared actinic radiation, generating free radicals which initiate the polymerization of the monomer or monomers without excessive termination. The photoinitiator is generally sensitive to visible or ultraviolet radiation, preferably ultraviolet radiation. The photoinitiator must also be insensitive to infrared radiation and should be thermally inactive at and below 185° C. Examples of suitable photoinitiators include the substituted and unsubstituted polynuclear quinones. Examples of suitable systems have been disclosed in Grüetzmacher, U.S. Pat. Nos. 4,460,675 and Feinberg et al., 4,894,315. Photoinitiators are generally present in amounts from 0.001% to 10.0% based on the weight of the photopolymerizable composition.

The photopolymerizable layer can contain other additives depending on the final properties desired. Such additives include sensitizers, rheology modifiers, thermal polymerization inhibitors, tackifiers, plasticizers, colorants, antioxidants, antiozonants, or fillers.

The thickness of the photopolymerizable layer can vary over a wide range depending upon the type of printing plate desired. For so-called "thin plates" the photopolymerizable layer can be from about 20 to 67 mils (0.05 to 0.17 cm) in thickness. Thicker plates will have a photopolymerizable layer up to 100–250 mils (0.25 to 0.64 cm) in thickness or greater. The process of this invention is particularly advantageous when using "thin" flexographic plates.

On the photopolymer layer, there is at least one layer of infrared radiation sensitive material which must be ablatable, i.e., vaporizes and/or decomposes upon exposure to infrared laser radiation.

The at least one layer of infrared radiation sensitive material should be capable of absorbing infrared radiation and should be opaque or substantially opaque to actinic radiation. This can be accomplished using a single material or a combination of materials. The at least one layer of infrared radiation sensitive material may also be referred to as the infrared sensitive layer or as the "actinic radiation opaque layer" (radiation opaque layer). Although the infrared sensitive layer is referred to herein as a single layer, it will be understood that two or more infrared sensitive layers can be used.

In order for the infrared sensitive layer to absorb infrared radiation, the infrared radiation sensitive material should include an infrared radiation absorbing agent which will be referred to as an infrared-absorbing agent. An infrared-absorbing agent is capable of strong absorption in the region of the imaging radiation, typically 750 to 20,000 nanometers (nm). Examples of suitable infrared-absorbing agents include dark inorganic pigments such as carbon black, graphite, copper chromite, chromium oxides and cobalt chrome aluminate; metals such as aluminum, copper or zinc; and alloys of bismuth, indium and copper. Metallic materials and alloys can be applied with and without a binder. Dyes are also suitable as infrared-absorbing agents. Examples of suitable dyes include poly(substituted) phthalocyanine compounds; cyanine dyes; squarylium dyes; chalcogenopyryloarylidene dyes; bis(chalcogenopyrylo)polymethine dyes; oxyindolizine dyes; bis(aminoaryl)polymethine dyes; merocyanine dyes; croconium dyes; metal thiolate dyes; and quinoid dyes.

Infrared-absorbing agents can be present in any concentration which is effective for the intended purpose. In general, for the organic compounds, concentrations of 0.1 to 40% by weight, based on the total weight of the infrared sensitive layer, have been found to be effective.

In order for the infrared sensitive layer to be opaque to ultraviolet or visible radiation, the infrared radiation sensitive material should include a radiation-opaque material. Any material which prevents the transmission of actinic light, which includes ultraviolet radiation and visible radiation, to the photopolymerizable layer can be used in the infrared radiation sensitive material as the radiation-opaque material. Examples of suitable radiation-opaque materials include dark inorganic pigments, metals, and alloys as discussed for the infrared absorbing agent. Dyes which absorb ultraviolet or visible radiation are also suitable as radiation-opaque materials. The concentration of radiation-opaque material which is needed decreases with increasing thickness of the infrared sensitive layer. In general, a concentration of 1–70% by weight, based on the total weight of the infrared sensitive layer can be used. It is preferred to use 2–50% by weight, based on the total weight of the infrared sensitive layer. Preferred radiation-opaque materials are carbon black and graphite. The concentration of carbon black as the radiation-opaque material is chosen so as to achieve the desired optical density, i.e., so that the radiation-opaque layer prevents the transmission of actinic radiation to the photopolymerizable layer. In general, a transmission optical density (OD) greater than 2.0 is preferred.

The dark inorganic pigments, metallic materials and alloys generally function as both infrared absorbing agent and radiation-opaque material. Carbon black is a particularly preferred dark inorganic pigment since carbon black functions as both the infrared absorbing agent and the radiation-opaque material in the infrared radiation sensitive material. In general, for the inorganic compounds, concentrations of 1 to 70% by weight, preferably 2 to 60%, based on the total weight of the infrared sensitive layer, have been found to be effective.

As is known to those skilled in the art, since one dye alone is not sufficient to function as both infrared-absorbing agent and radiation-opaque material, at least two dyes would be required to provide both functionalities to the infrared radiation sensitive material. It is also contemplated that the combination of a dye with a pigment would provide both functions to the infrared sensitive layer.

The infrared radiation sensitive material of the infrared sensitive layer must also include at least one binder which is self-ablative, i.e., vaporizes and/or decomposes upon exposure to infrared radiation in the absence of atmospheric oxygen. The self-ablative binder should ablate sufficiently to decompose into a dry, powdery, or even a brittle substance having little cohesive force. The dry, powdery substance produced by ablation is debris which is captured by a material capture sheet during imagewise laser exposure as will be explained later.

The self-ablative binder should satisfy several requirements. (1) The binder should be effectively removed by the heat generated by the infrared-absorbing agent when the layer is exposed to infrared laser radiation. (2) The binder should be removable from the surface of the photopolymerizable layer after the UV exposure imaging step. This condition is met if the binder is soluble, swellable, dispersible, or liftable in the developer solvent for the photopolymerizable layer. The binder may also be removed in a separate step, e.g., the binder can be soluble, swellable or dispersible in a second solvent which does not affect the polymerized areas of the photopolymerizable layer. (3) The binder should be one in which the other materials, i.e., infrared-absorbing agent and radiation-opaque material, in the infrared-sensitive layer can be uniformly dispersed. (4) The binder with all the additives should be capable of forming a uniform coating on the photopolymer layer.

Self-ablative binders suitable for use in the infrared radiation sensitive material include polymers with relatively low decomposition temperature. In general, it is preferred that the polymer for the infrared sensitive layer has a decomposition temperature less than 325° C., more preferably less than 275° C. Examples of polymers with relatively low decomposition temperature include polycarbonates, such as polypropylene carbonate; substituted styrene polymers, such as polyalphamethylstyrene; polyacrylate and polymethacrylate esters, such as polymethylmethacrylate and polybutylmethacrylate; cellulosic materials such as cellulose acetate butyrate and nitrocellulose; poly(vinyl)chloride; polyacetals; polyvinylidene chloride; polyurethanes; polyesters; polyorthoesters; acrylonitrile and substituted acrylonitrile polymers; maleic acid resins; and copolymers of the above. Organic polymeric binders containing nitrogen, such as nitrocellulose and nitroglycerine, are sometimes also referred to as self-oxidizing binders. A preferred self-ablating binder is nitrocellulose. Mixtures of the polymers can also be used. Additional examples of polymers having low decomposition temperatures can be found in Foley et al., U.S. Pat. No. 5,156,938. These include polymers which undergo acid-catalyzed decomposition. For these polymers it is frequently desirable to include one or more hydrogen donors with the polymer.

There must be sufficient self-ablative binder present in the layer of infrared radiation sensitive material so that the infrared irradiated areas of the infrared-sensitive layer ablate or oxidize to a dry, powdery substance having little cohesive force. If more than one layer of infrared sensitive material is present, at least one of the infrared sensitive layers must contain the self-ablative binder. If no or an insufficient amount of self-ablative binder is present in the infrared-sensitive layer, the materials in the irradiated areas of the infrared-sensitive layer could melt or degrade to a tacky substance, rendering poor image quality of the mask. The self-ablative binder is generally present up to about 50% by weight of the infrared-sensitive layer.

Although it is preferred that all the binder in the the infrared-sensitive material be a self-ablative binder or mixtures of self-ablative binders, the infrared-sensitive layer can optionally contain other binders. The optional binders can be used to provide other characteristics not provided by the self-ablative binders, such as elastomericity, scratch resistance, and chemical resistance to migratory materials in underlying layers, such as the photopolymerizable layer. The optional binders would satisfy the same requirements of the self-ablative binder described previously, as well as be compatible with the self-ablative binder.

Examples of optional binders suitable for use include non-self-oxidizing polymers such as ethylcellulose, polyacrylic acids and the metal alkali salts thereof; thermochemically decomposable polymers such as homopolymers and copolymers of acrylates, methacrylates, and styrene; butadiene, isoprene, and their copolymers (i.e., polymers of two or more monomers) and block copolymers with styrene and/or olefins; pyrolyzable polymers such as polyvinyl alcohol, polyvinyl chloride, and polyacrylonitrile; amphoteric interpolymers; and mixtures thereof. In the case where a barrier layer is interposed between the infrared sensitive layer and the photopolymer layer, optional binders in the infrared-sensitive layer further include elastomeric polymeric binders which are generally the same as, or similar to the elastomeric binders which can be used in the photopolymer layer. In the preferred case where the infrared sensitive layer is adjacent to the photopolymer layer (and no barrier layer is interposed), optional binders in the infrared-sensitive layer further include elastomeric polymeric binders which are generally incompatible with materials in the photopolymer layer. Those materials which are conventionally used as a release layer in flexographic printing elements, such as polyamides, polyvinyl alcohol, hydroxyalkyl cellulose, copolymers of ethylene and vinyl acetate, amphoteric interpolymers, and combinations thereof are suitable for use as the optional binder. A preferred optional binder is a polyamide. A binder mixture should contain 60 to 80% by weight of the self-ablative binder and 20 to 40 % by weight of the optional binder.

The properties of the infrared-sensitive layer can be modified by using other ingredients, such as, for example, pigment dispersants, plasticizers, dyes, surfactants, and coating aids, provided that they do not adversely affect the imaging properties of the element.

A dispersant is generally added when a pigment is present in the infrared-sensitive layer in order to disperse the fine particles and avoid flocculation and agglomeration. A wide range of dispersants is commercially available. A dispersant is selected according to the characteristics of the pigment surface and other components in the composition as practiced by those skilled in the art. Suitable dispersants are the A-B dispersants generally described in "Use of A-B Block Polymers as Dispersants for Non-aqueous Coating Systems," by H. K. Jakubauskas, Journal of Coating Technology, Vol. 58; Number 736; pages 71–82. The A segment of the dispersant adsorbs onto the surface of the pigment. The B segment of the dispersant extends into the solvent into which the pigment is dispersed. The B segment provides a barrier between pigment particles to counteract the attractive forces of the particles, and thus to prevent agglomeration. The B segment should have good compatibility with the binder used. Useful A-B dispersants are disclosed in U.S. Pat. Nos. 3,684,771; 3,788,996; 4,070,388 and 4,032,698. The dispersant is generally present in an amount of about 0.1 to 10% by weight, based on the total weight of the layer. Conventional pigment dispersing techniques, such as ball milling, sand milling, etc., can be employed.

A plasticizer can be added to adjust the film-forming properties of the self-ablative binder. Suitable plasticizers include, for example, triphenyl phosphite, dimethyl phthalate, diethyl phthalate, dicyclohexyl phthalate, cyclohexyl benzyl phthalate, dibutoxy ethyl adipate, ethylene glycol dibenzoate, pentaerythritol tetrabenzoate, glycerol diacetate, glyceryl carbonate, polyethylene glycol monolaurate, methyl phthalyl ethyl glycolate, o,p-toluenesulfonamide, N-ethyl-p-toluenesulfonamide, and N-cyclohexyl-o,p-toluenesulfonamide. The plasticizer should be present in an amount effective for the intended purpose which depends on the properties of the self-ablative binder, the plasticizer, and the other components of the layer, but not so much to cause the debris from ablation to be tacky. In general, the amount of plasticizer, when present, is 1–30% by weight, based on the weight of the layer.

The thickness of the infrared-sensitive layer should be in a range to optimize both sensitivity and opacity. The layer should be thin enough to provide good sensitivity, i.e., selected areas of the infrared-sensitive layer should be removed rapidly upon exposure to infrared laser radiation. At the same time, the layer should be thick enough so that the areas of the layer which remain on the photopolymerizable layer after imagewise exposure effectively mask the photopolymerizable layer from actinic radiation. In general, this layer will have a thickness from about 20 angstroms to about 50 micrometers. It is preferred that the thickness be from 40 angstroms to 40 micrometers.

Optionally, at least one barrier layer can be interposed between the photopolymerizable layer and the at least one layer of infrared radiation sensitive material. Barrier layers suitable for use in this invention are disclosed in U.S. Pat. No. 5,262,275 which is hereby incorporated by reference. It is preferred not to include a barrier layer in the photosensitive element because the element without the barrier layer is more sensitive to laser exposure fluences and thus, less laser energy is required to ablate the infrared-sensitive layer. Further, the photosensitive layer without the barrier layer is simpler and cheaper to manufacture.

The barrier layer can shield the photopolymerizable layer from atmospheric oxygen when the photopolymerizable layer is overall exposed to actinic radiation. The polymerization reactions require longer exposure times or higher intensity radiation sources, and the results are less reproducible when oxygen is present. It is possible to apply a temporary coversheet prior to exposure to actinic radiation or to carry out that exposure step in a vacuum frame. However, the photopolymerizable layer is usually inherently tacky and steps must be taken to prevent the temporary coversheet or vacuum frame cover from sticking to and/or damaging the surface of the photopolymerizable layer. The presence of a non-tacky barrier layer which minimizes the permeation of oxygen to the photopolymerizable layer addresses these problems.

The barrier layer must be transparent to infrared radiation, i.e., allow the infrared radiation to pass through the support unattenuated or substantially unattenuated when the element is exposed to laser radiation. The barrier layer must also be substantially transparent to actinic radiation so that when the element is exposed to actinic radiation, the radiation passes through the ablated areas of the infrared-sensitive layer and through the barrier layer to the photopolymerizable layer without significant diminution in intensity. The barrier layer should also initially (i.e., prior to exposure to actinic radiation) be soluble, swellable or dispersible in the developer solvent for the photopolymerizable layer or it should be liftable in that solvent. By "liftable" it is meant that the solvent is able to lift off the barrier layer at least partially intact. "Liftable" is distinguished from "peelable" in that "peelable" is a mechanical separation of layers. This is so that the barrier layer will be removed by the developer in at least those areas which are not exposed to actinic radiation, i.e., in those areas where the photopolymerizable layer is also removed.

Two types of barrier layers can be used. The first type is one which is insensitive to actinic radiation and is soluble, swellable, dispersible or liftable in developer solutions for the photopolymerizable layer both before and after exposure to actinic radiation. This type of barrier layer is completely removed in both exposed and unexposed areas, along with the unexposed areas of the photopolymerizable layer, during processing with the developer.

Examples of materials which are suitable for use as the barrier layer of this first type include those materials which are conventionally used as a release layer in flexographic printing elements, such as polyamides, polyvinyl alcohol, hydroxyalkyl cellulose, copolymers of ethylene and vinyl acetate, amphoteric interpolymers, and combinations thereof.

The second type of barrier layer is one which is soluble, swellable or dispersible in the developer solvent prior to exposure to actinic radiation, but is not affected by the developer solvent after exposure to actinic radiation. When this type of barrier layer is used it is removed by the developer solvent only in those areas which are not exposed to actinic radiation. The barrier layer which has been exposed to actinic radiation remains on the surface of the polymerized areas of the photopolymerizable layer and becomes the actual printing surface of the printing plate.

This type of barrier layer can be photosensitive itself, i.e., contain monomer and initiator, or it can become photosensitive when in contact with the photopolymerizable layer. This second type of barrier layer is usually a layer of an elastomeric composition. The composition can consist simply of a nonphotosensitive elastomeric binder layer similar to the binder in the photopolymerizable layer or it can be the binder in combination with a monomer and initiator. A preferred barrier layer is an elastomeric composition comprising an elastomeric polymeric binder, a second polymeric binder and optionally, a nonmigratory dye or pigment. The elastomeric polymeric binder in the elastomeric composition is generally the same as or similar to the elastomeric binder present in the photopolymer layer. Suitable compositions for the barrier layer are those disclosed as elastomeric compositions in the multilayer cover element described in Gruetzmacher et al., U.S. Pat. Nos. 4,427,759 and 4,460,675.

It is also possible to use more than one barrier layer. For example, an elastomeric barrier layer may be present next to the photopolymerizable layer and this, in turn, may be overcoated with a barrier layer which is soluble both before and after exposure to actinic radiation. The exact choice of barrier layer(s) will depend on the nature of the photopolymerizable layer and the infrared-sensitive layer and other physical requirements of the printing element.

In general, the barrier layer will have a thickness in the range of 0.01 to 3 mils (0.00025 to 0.076 mm). A preferred thickness range is 0.015 to 2.5 mils (0.00038 to 0.064 mm).

The photosensitive element can also include a temporary coversheet on top of the infrared-sensitive layer. The purpose of the coversheet is to protect the infrared-sensitive layer during storage and handling. It is important that the coversheet be removed prior to exposing the infrared-sensitive layer to infrared laser radiation. It is contemplated that the coversheet could also serve as a material capture sheet and thus it would remain on the element during the ablating step. Examples of suitable materials for the coversheet include thin films of polystyrene, polyethylene, polypropylene, polycarbonate, fluoropolymers, polyamide or polyester, which can be subbed with release layers.

The photosensitive element is generally prepared by first preparing the photopolymerizable layer on the support and then applying the infrared-sensitive layer by coating or lamination techniques.

The photopolymerizable layer itself can be prepared in many ways by admixing the binder, monomer, initiator, and other ingredients. It is preferred that the photopolymerizable mixture be formed into a hot melt and then calendered to the desired thickness. An extruder can be used to perform the functions of melting, mixing, deaerating and filtering the composition. The extruded mixture is then calendered between the support and a temporary coversheet or a temporary coversheet which has been previously coated with the barrier layer. In the latter case it is arranged so that the barrier layer is next to the photopolymerizable layer during the calendering process. If the barrier layer is desired, the adhesion between the barrier layer and the temporary coversheet should be low, so that the barrier layer will remain intact on the photopolymerizable layer when the temporary coversheet is removed. Alternatively, the photopolymerizable material can be placed between the support and the temporary coversheet or the barrier layer coated temporary coversheet in a mold. The layers of material are then pressed flat by the application of heat and/or pressure.

The infrared-sensitive layer is generally prepared by coating a layer of the infrared radiation sensitive material onto a temporary support which may serve as a coversheet for the photosensitive element. The infrared-sensitive layer can be applied to the temporary support using any known coating technique including gravure coating, knife coating, reverse-roll coating, slot-die coating and spray coating. It also can be applied by vapor deposition under vacuum or by sputtering. The last methods are particularly useful for metal layers. The adhesion of this temporary support should also be low so that the support is easily removed.

The final element can be prepared by removing the temporary coversheet from the photopolymerizable layer and placing the photopolymerizable layer together with the second element (temporary support and infrared-sensitive layer) such that the infrared-sensitive layer is adjacent to the photopolymerizable layer. This composite element is then pressed together with moderate pressure and elevated temperature. The temporary support, acting as a coversheet, can remain in place for storage, but must be removed prior to infrared radiation (IR) laser imaging.

In the case in which a barrier layer is between the photopolymerizable layer and the infrared-sensitive layer, the final element can be prepared by removing the temporary coversheet from the photopolymerizable layer and placing the photopolymerizable layer together with the second element (temporary support with infrared-sensitive layer and barrier layer) such that the barrier layer is adjacent to the photopolymerizable layer. Alternatively, the final element can be prepared by removing the temporary coversheet from the barrier layer on the photopolymerizable layer and placing the photopolymerizable layer together with the second element (temporary support and infrared-sensitive layer) such that the infrared-sensitive layer is adjacent to the barrier layer. This composite element is then pressed together with moderate pressure. The temporary support, which now functions as a coversheet, can remain in place for storage, but must be removed prior to IR laser imaging. Other methods of preparing the final photosensitive element are within the skill in the art and are disclosed in U.S. Pat. No. 5,262,275.

The final element can also be prepared by applying the infrared-sensitive layer directly onto the photopolymerizable layer or onto the optional barrier layer by using any known coating technique including spray coating and wire-wound bar coating. Alternatively, the final element can be prepared when the photopolymerizable layer is prepared by calendering the extruded photopolymer mixture between the support and the temporary support which has been previously coated with the infrared-sensitive layer.

A material capture sheet is also used in the process of this invention. The material capture sheet is adjacent to and at least in proximity to, or in contact with, the infrared-sensitive layer of the element during imagewise ablation of the infrared-sensitive layer to collect any debris from the layer. A support suitable for use in the material capture sheet includes paper and polymeric films, such as those formed by addition polymers and linear condensation polymers. A preferred polymeric film for the support is a polyester film, and particularly preferred is polyethylene terephthalate. The support for the material capture sheet can be any thickness, preferably 2 to 10 mils thick (0.0051 to 0.025 cm).

The material capture sheet can have one or more layers which assist in the capture of the debris resulting from the laser irradiation of the infrared-sensitive layer. The layer or layers which assist in debris capture result in decreased "back transfer" (defined later) at high exposure fluences and lower stain on the plate. Materials suitable to form one or more layers on the material capture sheet include thermally activated adhesives, such as hot melt adhesives, and thermoplastic-elastomeric binders. Thermally activated adhesives are solid materials which soften at elevated temperatures to enable them to act as adhesives. Suitable hot melt adhesives can be found in "Handbook of Adhesives", edited by I. Skeist, second edition, Van Nostrand Reinhold Company, N.Y., 1977, particularly Chapters 30 and 35. Examples of hot melt adhesives include, but are not limited to, polyamides, polyacrylates, polyolefins, polyurethanes, polyisobutylenes, polystyrenes, polyvinyl resins, polyester resins, and copolymers and blends of these and other polymers. Thermoplastic-elastomeric binders suitable for use in the material capture sheet are the same as the elastomeric binders described for the photopolymerizable layer. The coating on the support can be 40 angstroms to 40 micrometers thick.

Optionally, the layer or layers on the material capture sheet can include an infrared absorbing agent, such as those described above for the infrared sensitive layer; particularly suitable are dyes and pigments. In this instance, a dye which is sensitive to infrared radiation can be used. A preferred pigment for the infrared absorbing material is carbon black. The infrared absorbing agent when included with the thermally activatable adhesive will facilitate the thermal activation of the adhesive upon laser exposure. The infrared absorbing agent improves the heating of the thermally activated adhesive to render the adhesive tackier sooner than if no infrared absorbing agent were present in the layer. Thermal activation of the adhesive will assist in the capture of the debris. However, the infrared absorbing agent should not cause the layer on the material capture sheet to ablate upon laser irradiation of the photosensitive element. A preferred amount of infrared absorbing agent in the layer on the material capture sheet is 0.1 to 10% by weight of the adhesive.

Optionally, the layer or layers on the material capture sheet can include at least one matte agent. The matte agent when incorporated in the layer on the material capture sheet can create a separation gap between the infrared sensitive layer and the material capture sheet, so that the material capture sheet is not in contact with the infrared sensitive layer but in proximity to it. It is also contemplated that the matte agent can be included in the infrared sensitive layer, however its presence may adversely affect laser sensitivity. Thus, it is preferred to have the matte agent in a layer on the material capture sheet. An advantage of the separation gap where the material capture sheet is in proximity to, but not in contact with, the infrared sensitive layer is that upon ablation the heated debris material cannot transfer back to the ablated areas on the element by, for example, melt transfer and other back transfer mechanisms. Transfer back of debris material to the ablated areas on the element typically results in poor image quality and/or high stain level. Materials suitable as the matte agent are conventional in the art and include, but are not limited to, silica, rice starch, and polymethylmethacrylate beads. The average particle size of the matte agent is about 1 to 50 microns, preferably 2 to 10 microns. The materials are present in amounts of 0.25 to 10 mg/dm$^2$ of the layer and preferably in amounts from 1.0 to 1.6 mg/dm$^2$.

Alternatively, a polymeric film having surface roughness is also suitable for use as the support. The term "surface roughness" is intended to mean the microscopic peak-to-valley distances of film surface protuberances and depressions. The surface roughness can be achieved in any number of ways which are well known in the art. For example, suitable surface roughness for the support can be obtained by the inclusion into the polymeric film of particulate material having a large enough particle size to protrude through the film surface. Examples of such films include filled polyester films such as Melinex® 376, 377, 378 and 383 (sold by ICI, Wilmington, Del.) and Mylar® EB11 (sold by E. I. du Pont de Nemours and Company, Wilmington, Del.). Surface roughness can be achieved by other methods such as, for example, embossing, i.e., the lamination of a smooth support film to a second material having surface irregularities; surface treatments, e.g., sand blasting and chemical etching; and process treatments, e.g., acceleration of crystallization of melt extruded films or solvent coating techniques.

A material capture sheet having no assist layers, e.g., paper, is oriented adjacent and in proximity to, i.e., close to, the infrared-sensitive layer of the printing element during imagewise ablation. In this case, the paper does not need to contact the infrared-sensitive layer during image-wise ablation, but needs to be close enough so that the paper can capture any debris resulting from ablation. The fibrous nature of paper provides the separation gap. In the instance that the material capture sheet includes an assist layer of thermally activated adhesive which does not contain an infrared-absorbing agent, the assist layer should be oriented adjacent to and in contact with the infrared-sensitive layer of the printing element during imagewise ablation. Contact between the infrared-sensitive layer and the adhesive assist layer is necessary in order to activate the adhesive on the capture sheet by conduction with the photosensitive element when the laser ablates the infrared-sensitive layer. In the instance that the material capture sheet includes a layer of thermally activated adhesive combined with an infrared-absorbing agent, the assist layer should be oriented adjacent to and in proximity to the infrared-sensitive layer of the printing element during imagewise ablation. In this case, the assist layer on the material capture sheet is activated by both absorption and conduction with the printing element when the laser ablates the infrared-sensitive layer, so that closeness of the assist layer to the infrared-sensitive layer suffices to capture any debris generated by ablation.

Stain is the residual of the infrared-sensitive layer remaining in the ablated areas of the photosensitive element after imagewise ablation. Minimal stain is desired since stain inhibits the subsequent exposure of the photosensitive element to actinic radiation by partially absorbing that radiation before it reaches the photopolymerizable layer underneath.

"Back transfer" is the re-adherence or partial re-adherence of the debris created from laser ablation of areas of the infrared-sensitive layer onto the photosensitive element. At optimum laser exposure, the areas of the infrared sensitive layer are ablated from the photosensitive element, creating debris which is captured on the material capture sheet. If laser exposure is too high, the debris from the infrared-sensitive layer and the infrared sensitive agent (if present) in the material capture sheet will continue heating after imagewise laser ablation of the infrared sensitive layer. Eventually, the debris from the infrared sensitive layer and/or from the material capture sheet will partially adhere back onto the photosensitive element. At high laser fluence, back transfer results in high stain levels. Back transfer can be reduced by improving the laser-induced adhesion of ablated infrared sensitive to the material capture sheet. Thus, the layer of the thermally activated adhesive on the material capture sheet aids in the capture of the ablated debris and reduces back transfer. Also, porous paper as the material capture sheet embeds and captures the ablated debris to reduce back transfer. Similar to stain, back transfer inhibits the subsequent exposure of the photosensitive element to actinic radiation by partially absorbing that radiation before it reaches the photopolymerizable layer underneath. In this instance, both stain and back transfer are expressed as the optical density of the laser exposed areas of the infrared sensitive layer, and the lower the optical density (OD) the better for subsequent actinic radiation exposure.

The process of the invention involves (1) placing a material capture sheet in proximity to the infrared-sensitive layer (c) of the photosensitive element described above; (2) imagewise ablating layer (c) through layers (a) and (b) to form a mask; (3) removing the material capture sheet; (4) overall exposing the photosensitive element to actinic radiation through the mask; and (5) treating the product of step (4) with at least one developer solution to remove (i) the infrared-sensitive material which was not removed during step (2), (ii) the areas of the photopolymerizable layer (b) which were not exposed to actinic radiation.

The first step in the process of the invention is to place a material capture sheet in close proximity to layer (c) the at least one layer of infrared radiation sensitive material. If a temporary coversheet is present, it should be removed prior to this step. The material capture sheet may be taped, clamped, held by vacuum or otherwise held in place in a laser exposure unit. The material capture sheet and the photosensitive element are oriented on a flat bed or drum of a laser exposure unit in such a way that (a) a beam of laser radiation from the exposure unit will impinge the photosensitive element from the support side, i.e., the infrared sensitive layer of the photosensitive element faces away from the origin of the laser beam, and, (b) the infrared-sensitive layer of the photosensitive element is adjacent and at least in proximity to the material capture sheet or to any layers on the material capture sheet. It is preferred that the infrared-sensitive layer of the photosensitive element be adjacent to and in contact with the material capture sheet or any assist layers on the material capture sheet.

The next step in the process of the invention is to imagewise ablate layer (c) to form a mask. The beam of the laser radiation impinges the photosensitive element from the support side of the element, i.e., the side of the photosensitive element opposite that bearing the infrared-sensitive layer. The laser beam passes through the infrared transparent support and the infrared transparent photopolymerizable layer, (and through the optional barrier layer if present) and is focused at the interface between the infrared sensitive layer and the photopolymer layer, to imagewise ablate the infrared-sensitive layer. The exposure can be carried out using various types of infrared lasers. Diode lasers emitting in the region of 750 to 880 nm offer substantial advantages in terms of their small size, low cost, stability, reliability, ruggedness and ease of modulation. Diode lasers emitting in the range of 780 to 980 nm may be used to advantage. Such lasers are commercially available from, for example, Spectra Diode Laboratories (San Jose, Calif.). YAG lasers emitting at 1064 nm are also very effective. Surprisingly, the laser beam is not significantly attenuated in passing through the support and photopolymerizable layer and still has enough power to ablate the infrared sensitive layer.

In the infrared imagewise ablating step, material in the infrared-sensitive layer is removed in the areas exposed to the infrared laser radiation. A mask is formed in situ on the photopolymerizable layer. The areas exposed to laser radiation in the infrared-sensitive layer correspond to those areas in the photopolymerizable layer which will be polymerized to form the final printing plate. After laser ablation, a pattern of actinic radiation-opaque material remains on the photopolymerizable layer, or on the optional barrier layer over the photopolymerizable layer. The areas in which the infrared-sensitive layer and the radiation-opaque layers remain correspond to the areas of the photopolymerizable layer which will be washed out in the formation of the final printing surface.

After imagewise ablation of the photosensitive element, the photosensitive element is removed from the laser exposure unit and thereby separated from the material capture sheet, i.e., the material capture sheet is removed from the photosensitive element.

The next step in the process of the invention is to overall expose the photosensitive element to actinic radiation through the mask. The type of radiation used is dependent on the type of photoinitiator in the photopolymerizable layer. The radiation-opaque material in the infrared sensitive layer which remains on top of the photopolymer layer, or on top of the optional barrier layer on the photopolymerizable layer, prevents the material beneath from being exposed to the radiation and hence those areas covered by the radiation-opaque material do not polymerize. The areas not covered by the radiation-opaque material are exposed to actinic radiation and polymerize. Any conventional source of actinic radiation can be used for this exposure step.

Examples of suitable visible or UV sources include carbon arcs, mercury-vapor arcs, fluorescent lamps, electron flash units, electron beam units and photographic flood lamps. The most suitable sources of UV radiation are the mercury-vapor lamps, particularly the sun lamps. A standard radiation source is the Sylvania 350 Blacklight fluorescent lamp (FR 48T12/350 VL/VHO/180, 115 w) which has a central wavelength of emission around 354 nm.

The actinic radiation exposure time can vary from a few seconds to minutes, depending upon the intensity and spectral energy distribution of the radiation, its distance from the photosensitive element, and the nature and amount of the photopolymerizable composition. Typically a mercury vapor arc or a sunlamp is used at a distance of about 1.5 to about 60 inches (3.8 to 153 cm) from the photosensitive element. Exposure temperatures are preferably ambient or slightly higher, i.e., about 20° to about 35° C. The process of the invention usually includes a back exposure or backflash step. This is a blanket exposure to actinic radiation through the support. It is used to create a shallow layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. The backflash exposure can take place before, after or during the other imaging steps. It is preferred that it take place just prior to or after the imagewise exposure to infrared laser radiation.

Any of the conventional radiation sources discussed above can be used for the backflash exposure step. Exposure time generally range from a few seconds up to about a minute.

Following overall exposure to UV radiation through the mask formed by the actinic radiation-opaque material, the image is developed by washing with a suitable developer. Development is usually carried out at about room temperature. The developers can be organic solvents, aqueous or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the composition. However, washout is frequently carried out in an automatic processing unit which uses developer and mechanical brushing action to remove the unexposed portions of the plate, leaving a relief constituting the exposed image and the floor.

A pre-development step may be necessary if the infrared-sensitive layer is not removable by the developer solvent. An additional developer, which does not affect the polymerized photosensitive material can be applied to remove the infrared-sensitive layer first. This is particularly true when metallic materials are used. In such cases, etching solvents are used, such as 2% aqueous KOH solution.

Following solvent development, the relief printing plates are generally blotted or wiped dry, and then dried in a forced air or infrared oven. Drying times and temperatures may vary, however, typically the plate is dried for 60 to 120 minutes at 60° C. High temperatures are not recommended because the support can shrink and this can cause registration problems.

Most flexographic printing plates are uniformly post-exposed to ensure that the photopolymerization process is complete and that the plate will remain stable during printing and storage. This post-exposure step utilizes the same radiation source as the main exposure.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, Gruetzmacher, U.S. Pat. Nos. 4,400,459; Fickes et al., 4,400,460 and German Patent 28 23 300. Detackification can also be accomplished by exposure to radiation sources having a wavelength not longer than 300 nm, as disclosed in European Published Patent Application 0 017927 and Gibson U.S. Pat. No. 4,806,506.

Unless otherwise indicated, the term "flexographic printing plate or element" encompasses plates or elements in any form suitable for flexographic printing, including, but not limited to, flat sheets. All publications or references mentioned herein are hereby incorporated by reference unless otherwise indicated.

Particularly in view of the thickness of the photopolymerizable layers used for flexographic relief printing elements, it is surprising that the laser beam is not significantly attenuated in passing through the support and photopolymerizable layer and still has enough power to ablate the infrared sensitive layer. This method can be referred to as passing the laser "through-the-back." The process of this invention, in addition, provides several advantages when compared to laser ablation of the infrared sensitive layer of the photosensitive element where the laser beam does not pass through the support and the photopolymer layer, but rather impinges the infrared sensitive layer directly, i.e., "from-the-front."

An advantage of the instant process in which the laser beam impinges the photosensitive element through the back is that it achieves a higher sensitivity of ablative imaging than the laser exposure beam impinging from the front of the infrared-sensitive layer. It is believed that the high sensitivity is due to the laser energy being absorbed right at the interface between the infrared sensitive layer and the photopolymer layer, and in the case of a photosensitive element with a barrier layer, the laser energy is absorbed right at the interface of the infrared-sensitive layer and the barrier layer. A result of the higher sensitivity is that the ablated areas of the infrared-sensitive layer have lower stain. At low laser exposures, for the same laser fluence the laser impinging "through-the-back" of the photosensitive element results in a lower stain than when the laser impinges "from-the-front." Also, at similar stain levels, laser fluence through the back is lower than the laser fluence from-the-front. High sensitivity also allows for the use of a wider variety of and/or less expensive laser write engines and faster write speed. Another advantage is that airborne debris is not generated by the use of the material capture sheet. An additional advantage relative to ablation transfer methods is that the radiation-opaque areas remaining after ablation maintain a high maximum density (Dmax). The high Dmax and low stain result in a printing element with acceptable print quality.

EXAMPLES

In the following examples, Cyrel® flexographic printing plates, Cyrel® light finishing unit, and Optisol® rotary solvent, and Mylar® polyester film are products sold by E.I. du Pont de Nemours and Company, Wilmington, Del.

EXAMPLE 1

Example 1 demonstrates the process of this invention in which a photosensitive printing element having an infrared sensitive layer is exposed through a support and a photopolymerizable layer of the element with infrared laser radiation. The infrared sensitive layer includes a self-ablative binder and an elastomeric binder.

An infrared-sensitive layer on a flexographic photosensitive printing element was prepared as follows:

A self-ablative binder component, nitrocellulose, was introduced using Dispercel® CBJ. Dispercel® CBJ is solid dispersion from Runnemede Dispersions KV (UK). It contains 45% carbon black, 35% nitrocellulose, and the remainder plasticizer and dispersant. This was dispersed in methanol at 12% solids to form a "Dispercel® Stock Solution".

The elastomeric binder component, a polyamide binder known as Macromelt® from Henkel Corp., Minneapolis, Minn., was introduced by precompounding 67% Macromelt® with 33% carbon black. This mixture was dispersed at 12% solids in n-propanol to form a "Macromelt® Stock Solution".

Eighty parts of the Dispercel® Stock Solution and 20 parts of the Macromelt® Stock Solution were mixed.

A photopolymerizable layer on a support was obtained using a Cyrel® Type HOS45 flexographic printing element. The photopolymerizable layer of the element was about 45 mils thick on a polyester support. A coversheet was peeled off of the printing element, to reveal a release layer which functions as a barrier layer surface as described in U.S. Pat. No. 5,262,275.

The mixed solution was coated onto the barrier layer surface of the printing element using a wire-wound bar to form a laser ablation mask photosensitive element. Several coating passes were required to reach the desired optical density (2.5–2.8) of the infrared sensitive layer, i.e., radiation-opaque layer, of the photosensitive element.

The laser exposure unit used was an external drum write engine (sold by Creo Products Inc., Vancouver, Canada) equipped with a write head array assembly composed of 32 semiconductor 100 mW diode lasers emitting at 830 nm wavelength.

A material capture sheet (Heavy paper stock, 5.5 mil thick, smooth surface) was taped to an exposure drum of the laser exposure unit. The element was placed with the infrared sensitive layer side down on the material capture sheet and taped in place. The laser beam passed through the support and the photopolymerizable layer of the photosensitive element, i.e., through-the-back exposure, to imagewise ablate the infrared-sensitive layer and form a mask in situ. The image was written at 453 milli joule/cm$^2$ (mJ/cm$^2$) fluence, i.e., exposure, to achieve a stain level of optical density (OD) 0.55 on the infrared-sensitive layer.

After imagewise laser ablating the infrared-sensitive layer, the element was removed from the material capture sheet on the drum. The element was given a backflash exposure for 10 seconds on a Cyrel® 3040 light source and then given a top exposure, i.e., through the mask of imaged infrared-sensitive layer, for 10 minutes using the same light source without a vacuum. The exposed element was developed in a rotary processor for 7 minutes using Optisol® rotary solvent. The mask and the barrier layer were removed in the developer. The photopolymerizable layer and the elastomeric barrier layer were removed in the unexposed areas only. The plate was oven dried for 20 minutes at 60° C. and then simultaneously post-exposed and light finished in a Cyrel® light finishing unit for 2 minutes. The resultant flexographic printing plate had a tonal range of 15–95% at 150 lpi, with 15 mil relief. These results indicate that the flexographic plate would print acceptably.

EXAMPLE 2 AND COMPARISON 1

This example illustrates the advantages of laser ablating a photosensitive element having an infrared-sensitive layer using the process of the invention in which the infrared-sensitive layer is imagewise exposed with the laser radiation passing through the support and the photopolymerizable layer. Example 2 is compared to a process for imagewise exposure of the infrared-sensitive layer in which laser radiation does not pass through the element but impinges directly onto the infrared-sensitive layer of the plate.

A coversheet on two Cyrel® HOS45 flexographic printing elements was removed to reveal a release layer. The composition of the infrared-sensitive layer of Example 1 was spray coated on the release layer of the elements. The coating quality was not as good as the wire-wound bar coating, so all sensitivities were worse, i.e., more laser energy was required (compared to the exposure in Example 1) to achieve the same degree of clearing of the infrared sensitive layer.

Laser ablation of the infrared-sensitive layer of the first plate element was conducted as described in Example 1, i.e., through-the-back, so that an exposure of 715 mJ/cm$^2$ provided a stain level of OD 0.55. The second plate element was imagewise exposed with the laser radiation impinging directly onto the infrared-sensitive layer of the plate, i.e., from-the-front. Exposure of the second plate at 1200 mJ/cm2 was not enough to produce an image.

It was concluded that at least 1200 mJ/cm$^2$ of fluence, and probably much more, is required to achieve a comparable stain level when the infrared-sensitive layer of a photosensitive element is imagewise exposed with laser radiation from the front versus through the back of the plate.

EXAMPLE 3

This example demonstrates the advantages of laser exposure of the infrared sensitive layer through the back of a photosensitive element, using elements having different thicknesses of the photopolymerizable layer.

Cyrel® HOS photosensitive plates were each coated with the infrared-sensitive layer on the release layer as described in Example 1. The thickness of the photopolymerizable layer (which included the support at a thickness of about 5 mil) of each of the plates was about 45 mil, 67 mil, and 112 mil.

Laser exposure tests were carried out on an experimental apparatus. The experimental apparatus consists of an 18 W Nd:YAG laser (Quantronix, Hauppauge, N.Y.) emitting a TEM00 beam focussed through an acousto-optic modulator (Crystal Technology, Palo Alto Calif.). The beam was scanned with a 1-axis galvanometer (Cambridge Technology, Watertown Mass.) to produce vertically oriented fastscan lines 50 mm in length. This was focused with an f-theta scan lens (Special Optics, Little Falls N.J.) to produce 11.4 micron spots at the media plane. The plate was held by vacuum on a precision 1-axis table (Aerotech, Pittsburgh Pa.), which produces the slow-scan motion. The system was programmed to produce isolated laser "pecks" at 10.6 micron spacing. Fluence was controlled by changing the duration of the laser "pecks" from 0.05–6 microseconds.

Each of the elements with the infrared-sensitive layer was cut into two samples. Each sample of the elements was laser exposed on the apparatus described above in which one sample was oriented (1) with the laser beam impinging the infrared-sensitive layer on the front or top side of the element, and the other sample was oriented (2) with the laser impinging the infrared-sensitive layer through-the-back of the plate, i.e., laser passing through a support and the photopolymerizable layer of the element. A 5 mil coated paper stock was used as the material capture sheet for the through-the-back exposure.

In each case, the plate sample exposed through-the-back exhibited minimum stain at 780 mJ/cm$^2$. (At high exposures, the stain increases due to back transfer). The table below lists the resultant stain for these plates under from-the-front and through-the-back exposure at the same fluence of 780 mJ/cm$^2$. Minimal stain is desired since stain inhibits the subsequent exposure to actinic radiation by partially absorbing that radiation before it reaches the photopolymeric layer underneath.

| Plate Thickness mils | Stain OD Front Exposure 780 mJ/cm$^2$ | Stain OD Back Exposure 780 mJ/cm$^2$ |
| --- | --- | --- |
| 45 | 1.22 | 0.45 |
| 67 | 1.47 | 0.63 |
| 112 | 1.00 | 0.70 |

EXAMPLE 4

This example demonstrates the use of an adhesive coated material capture sheet to decrease back transfer at high exposure fluences.

A material capture sheet, a Waterproof® Transfer Sheet (sold by E.I. DuPont, Wilmington Del.) consisted of a 4 mil layer of hot melt glue, i.e., a thermally activated adhesive, on 4 mil polyester support. The material capture sheet was placed with the adhesive layer side out on the vacuum table of the experimental apparatus described in Example 3. A photosensitive element, Cyrel® HOS67 photopolymer printing plate, has a photopolymerizable layer about 67 mils thick, and a release layer which was revealed when the coversheet was removed. The photosensitive element was coated with an infrared-sensitive layer on the release layer as described in Example 1. The element with the infrared-sensitive layer was placed on the material capture sheet with the infrared-sensitive layer oriented toward the adhesive coating of the material capture sheet. The so-oriented sample was laser exposed through-the-back with a range of fluences.

A second HOS67 photosensitive element was identically prepared with an infrared-sensitive layer as described above. The second plate with the infrared-sensitive layer was oriented the same way on the vacuum table of the apparatus described in Example 3, but an uncoated paper stock was used as the material capture sheet. The second element was laser exposed through-the-back with a range of fluences.

The optical density (OD) of the exposed areas of both elements was then measured as a function of exposure fluence. Each sample reached similar minimum stain level of OD 0.6 at 780 mJ/cm$^2$ fluerice. As the exposure fluence was increased beyond 780 mJ/cm$^2$ fluence, the OD increased as the result of back transfer, eventually reaching a constant value. The stain of the plate was OD=1.7 when the adhesive-coated material capture sheet was used. In comparison, the stain of the second plate was OD=2.1 when the uncoated paper stock was used as the material capture sheet. Since the adhesive-coated material capture sheet had lower stain at high exposure fluences than the non-adhesive coated paper, the adhesive coating decreased back transfer at high exposure fluences.

EXAMPLE 5

The purpose of this example is to demonstrate further decrease (when compared to Example 4) in back-transfer of material at high laser exposure fluences by including an infrared absorbing agent in the coated layer on the material capture sheet.

A material capture sheet with a layer containing a thermally activated adhesive and an infrared absorbing agent was prepared as follows. Carbon black was compounded with Kraton® thermoplastic binder, a polystyrene-polyisoprene-polystyrene block copolymer (made by Shell Oil Co, Houston, Tex.) to a loading of 9% by weight. 0.6 g of the carbon black-binder mixture and an additional 5.4 g of Kraton® thermoplastic binder were dissolved in toluene to make 100 g of solution. The solution was knife coated with a 4 mil knife on Mylar® 200D polyester film support. The thermally activated material capture sheet had a grey color.

As a control, a control material capture sheet was also prepared. 10 g of Kraton® thermoplastic binder were dissolved in toluene to make 100 g solution. This solution was knife coated with a 4 mil knife on Mylar® 200D polyester film support. The control material capture sheet was colorless.

A HOS45 mil flexographic printing element was prepared with an infrared sensitive coating as described in Example 3 to make two photosensitive element samples. Each sample was positioned and exposed on the apparatus as described in Example 3. One sample was laser exposed with the material capture sheet having the thermally activated adhesive layer. The other sample was laser exposed with the control material capture sheet. Both samples were laser exposed through-the-back. At exposure fluences greater than 10 J/cm$^2$) the sample using the thermally activated material capture sheet during laser exposure exhibited significantly lower stain than the sample used with the control material capture sheet. (OD approximately 0.5 vs. 1.0)

The coating on the material capture sheet is a thermally activated adhesive. The addition of the infrared absorbing agent facilitates heating of the adhesive on the material capture sheet, and results in decreased back transfer and lower stain on the element.

EXAMPLE 6

The purpose of this example is to demonstrate the process of this invention using a printing element which does not have a barrier layer (or a release layer) between the photopolymerizable layer and an infrared-sensitive layer.

An infrared-sensitive solution was prepared as described in Example 3. A cover sheet was removed from a Cyrel® HOS45 printing element to reveal a release layer on a 45 mil photopolymerizable layer. The release layer was removed by using adhesive tape to lift and peel the release layer from the photopolymerizable layer. The infrared-sensitive solution was coated with a wire-wound bar directly onto the photopolymerizable layer of the plate.

The photosensitive element with the infrared-sensitive layer was laser exposed in each orientation as described in Example 3 with different levels of exposure fluence. A 5 mil coated paper stock was used as the material capture sheet. As shown in the following Table, exposure through-the-back gives lower stain at low fluences than exposure from-the-front. Further, the barrier layer between the photopolymer layer and the infrared-sensitive layer is not necessary for the method of this invention.

| Exposure fluence (J/cm2) | Stain OD Front Exposure | Stain OD Back Exposure |
|---|---|---|
| 0.05 | 3.07 | 2.17 |
| 0.10 | 2.20 | 1.32 |
| 0.30 | 1.41 | 0.77 |

EXAMPLE 7

The example demonstrates the process of this invention using a self-ablative binder only in the infrared-sensitive layer.

The Dispercel® Stock Solution was prepared as described in Example 1. A coversheet was removed from a Cyrel® HOS45 flexographic printing element to reveal a release layer which functions as a barrier layer. The Dispercel® Stock Solution was coated directly onto the release layer of the element. The element was laser exposed as described in Example 3.

As before, laser exposure through-the-back of the plate provides lower stain at low fluences than exposure from-the-front. At 0.30 J/cm$^2$, exposure through the back gave stain level of OD 0.85, compared with OD 1.53 when exposed from the front.

EXAMPLE 8

This example demonstrates the process of this invention using a photosensitive element having an infrared sensitive layer which uses a different self-ablative binder.

The infrared radiation sensitive material was prepared as follows: 3 grams of polypropylene carbonate (from PAC Polymers, Inc., Allentown, Pa.) and 3 grams of a carbon black dispersion ("Microlith C-K" from Ciba Geigy, Newport, Del.) were dispersed in 34 grams acetone to make a coating solution.

The barrier (release) layer was removed from a Cyrel® HOS67 flexographic printing element. The printing element was coated with the above coating solution using a #24 wire-wound coating bar. Several coating passes were needed to achieve an optical density of the structure of the photosensitive element (plate and coating) greater than 2.6.

The element was ablated from-the-front and through-the-back using the experimental apparatus as described in Example 3. At exposure of 2.6 J/cm$^2$, the optical density of the structure was 0.89 for through the back ablation, versus 1.65 for from the front ablation. Therefore, the image achieved a lower stain when ablated through the back. The ablated material was dry and powdery.

What is claimed is:

1. A process for making a flexographic printing plate, comprising:
   (1) providing a photosensitive printing element comprising in the order listed:
   (a) an infrared-transparent support;
   (b) an infrared-transparent photopolymerizable layer having at least one elastomeric binder, at least one monomer and an initiator having sensitivity to non-infrared actinic radiation, said layer being soluble, swellable, or dispersible in a developer solution; and
   (c) at least one layer of infrared radiation sensitive material having at least one self-ablative binder, said layer being substantially opaque to non-infrared actinic radiation;
   (2) placing a material capture sheet in proximity to layer (c);
   (3) imagewise ablating layer (c) through layers (a) and (b) with infrared laser radiation to form a mask;
   (4) removing the material capture sheet;
   (5) overall exposing the photosensitive element to actinic radiation through the mask; and
   (6) treating the product of step (5) with at least one developer solution to remove (i) the infrared sensitive material which was not removed during step (3), and (ii) the areas of the photopolymerizable layer (b) which were not exposed to non-infrared actinic radiation.

2. A process for making a flexographic printing plate, comprising:
   (1) providing a photosensitive printing element comprising in the order listed:
   (a) an infrared-transparent support;
   (b) an infrared-transparent photopolymerizable layer having at least one elastomeric binder, at least one monomer, and an initiator having sensitivity to non-infrared actinic radiation, said layer being soluble, swellable or dispersible in a developer solution;
   (c) at least one layer of infrared radiation sensitive material having at least one self-ablative binder, said layer being substantially opaque to non-infrared actinic radiation; and
   (d) a cover sheet;
   (2) removing the cover sheet;
   (3) placing a material capture sheet in proximity to layer (c);
   (4) imagewise ablating layer (c) through layers (a) and (b) with infrared laser radiation to form a mask;
   (5) removing the material capture sheet;
   (6) overall exposing the photosensitive element to actinic radiation through the mask; and
   (7) treating the product of step (6) with at least one developer solution to remove (i) the infrared sensitive material which was not removed during step (4), and (ii) the areas of the photopolymerizable layer (b) which were not exposed to non-infrared actinic radiation 3. The process according to claims 1 or 2, wherein at least one infrared transparent barrier layer (e) which is substantially transparent to non-infrared actinic radiation is situated between layers (b) and (c), the process further comprising imagewise ablating layer (c) through layers (a), (b) and (e) with infrared laser radiation.

4. The process according to claim 3, wherein the product of the overall exposure step is treated sequentially with at least one developer solution to remove (i) the infrared-sensitive material which was not removed during imagewise ablation, (ii) at least the areas of the barrier layer which were not exposed to non-infrared actinic radiation, and (iii) the areas of the photopolymerizable layer (b) which were not exposed to actinic radiation.

5. The process according to claim 3, wherein the product of the overall exposure step is treated sequentially with a first developer solution to remove (i) the infrared-sensitive material which was not removed during imagewise ablation, and a second developer solution to remove (ii) at least the areas of the barrier layer which were not exposed to non-infrared actinic radiation, and (iii) the areas of the photopolymerizable layer (b) which were not exposed to actinic radiation.

6. The process according to claim 1 or 2, further comprising applying at least one layer of a thermally activated adhesive on the material capture sheet before placing the material capture sheet in proximity to the layer (c).

7. The process according to claim 1 or 2, further comprising applying at least one layer of a material comprising a thermally activated adhesive and an infrared absorbing agent on the material capture sheet before placing the material capture sheet in proximity to the layer (c).

8. The process according to claim 1, further comprising after step (1) and prior to step (6): (7) backflash exposing the element overall to non-infrared actinic radiation through the support.

9. The process according to claim 2, further comprising after step (1) and prior to step (7): (8) backflash exposing the element overall to non-infrared actinic radiation through the support.

10. The process according to claim 1, further comprising a post-exposure step after step (6).

11. The process according to claim 2, further comprising a post-exposure step after step (7).

12. The process according to claim 1, further comprising a detackification treatment after step (6).

13. The process according to claim 2, further comprising a detackification treatment after step (7).

14. The process according to claim 12 or 13, wherein the detackification treatment comprises exposure to light having a wavelength not longer than 300 nm.

15. A process according to claim 1 or 2, wherein the product of the overall exposure step is treated sequentially with one developer solution to remove (i) the infrared-sensitive material which was not removed during imagewise ablation, and a second developer solution to remove (ii) the areas of the photopolymerizable layer (b) which were not exposed to actinic radiation.

* * * * *